United States Patent
Shimoda

(10) Patent No.: US 6,756,269 B2
(45) Date of Patent: Jun. 29, 2004

(54) METHOD FOR MANUFACTURING NONVOLATILE SEMICONDUCTOR MEMORY DEVICE

(75) Inventor: Kouichi Shimoda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/411,084

(22) Filed: Apr. 11, 2003

(65) Prior Publication Data

US 2004/0014282 A1 Jan. 22, 2004

(30) Foreign Application Priority Data

Jul. 17, 2002 (JP) ........................................ 2002-208249

(51) Int. Cl.[7] ............................................ H01L 21/336
(52) U.S. Cl. ....................................... 438/257; 438/262
(58) Field of Search ................................. 438/257–267; 257/314–330

(56) References Cited

U.S. PATENT DOCUMENTS

| | | | |
|---|---|---|---|
| 5,053,349 A | | 10/1991 | Matsuoka |
| 5,482,881 A | * | 1/1996 | Chen et al. .................. 438/264 |
| 5,527,727 A | * | 6/1996 | Kim ........................... 438/263 |
| 5,693,972 A | | 12/1997 | Liu |
| 6,180,460 B1 | * | 1/2001 | Cremonesi et al. .......... 438/264 |
| 6,194,270 B1 | * | 2/2001 | Bottini et al. ................ 438/258 |
| 6,255,155 B1 | * | 7/2001 | Lee et al. .................... 438/222 |
| 2002/0100930 A1 | * | 8/2002 | Yaegashi ..................... 257/315 |

FOREIGN PATENT DOCUMENTS

| | | |
|---|---|---|
| JP | 03-211774 | 9/1991 |
| JP | 05-343693 | 12/1993 |

* cited by examiner

*Primary Examiner*—W. David Coleman
*Assistant Examiner*—Brook Kebede
(74) *Attorney, Agent, or Firm*—Volentine Francos, PLLC

(57) ABSTRACT

A patterning of a first poly-silicon is processed, to divide the first poly-silicon into memory elements and expose silicon substrate portions which function as boundaries. A second poly-silicon is formed on the silicon substrate. A first N+ impurity diffusing region is formed by diffusing impurities included in the second poly-silicon into the silicon substrate at the boundary via heat-treatment. Then, using the first and second poly-silicon as a material of a floating gate, forming a material of an intermediate insulating film on this material, and forming a material of a control gate on the insulating film, a control gate and a floating gate are formed by etching these materials. Finally, a second impurity diffusing region is formed in the silicon substrate, the second impurity diffusing region being connected with the first impurity diffusing region.

9 Claims, 3 Drawing Sheets

PRIOR ART

METHOD FOR MANUFACTURING NONVOLATILE SEMICONDUCTOR MEMORY DEVICE

BACKGROUND OF THE INVENTION

1. Field of the Invention

The present invention relates to a method for manufacturing nonvolatile semiconductor memory device which is equipped with floating gate.

2. Description of the Related Art

A nonvolatile semiconductor memory equipped with a floating gate is known well as EPROM etc. This kind of memory device comprises a big floating gate array arranged like lattice work on a semiconductor chip.

To begin with, a conventional method for manufacturing this kind of device will be described, referring to FIG. 2. Each process which comprises the method of conventional art is shown in FIG. 2(a) to FIG. 2(e).

As shown in FIG. 2(a), in an initial process of manufacturing memory device, on a silicon substrate 1, a field oxide film 2 is formed by LOCOS method which is known in public. This field oxide film 2 is formed like latticework. In FIG. 2(a) to FIG. 2(e), shown is a section of a portion of silicon substrate 1 located between neighboring lattices. Thus, the surface of silicon substrate 1 is divided into blocks, so as to form regions for memory elements.

In FIG. 2(b), a gate oxide film 3 is generated by oxidation with heat-treatment. This comprises an insulating film for insulating a floating gate from the silicon substrate 1.

And, on this gate oxide film 3, generated is a first poly-silicon 4, which includes N-type impurity, by LPCVD method known in public. This comprises a portion of a floating gate in the later process.

Here, for the purpose of finishing a floating gate adequately, when it is formed in the later process, the first poly-silicon 4 is treated as follows.

That is, a lattice patterning is performed by photo-lithographic etching technique known in public. And, formed is each first poly-silicon 4 divided into each element.

In FIG. 2(c), at first, an IPO film 5, which comprises ONO film etc. is generated by a certain method known in public. This is an intermediate insulating film between the floating gate and a control gate. As an example of this, a three-storied structure of oxide film, nitride film and oxide film, is used.

After this, a second poly-silicon 6 which includes N-type impurity, is generated by LPCVD method known in public. This is going to comprise a portion of control gate in the later process.

Next, a high melting point metallic suicide 7 such as WSix etc. is formed by spattering method or LPCVD method known in public. This is going to comprise a portion of control gate in the later process.

In FIG. 2(d), patterning is performed by photo-lithographic etching technique known in public. By this patterning, formed is a control gate 8 which comprises high melting point metallic silicide 7 and second poly-silicon 6. In addition, formed is a floating gate 9 which comprises first poly-silicon 4. These are performed by etching suicide 7, second poly-silicon 6, IPO film 5, first poly-silicon 4 and gate oxide film 3 respectively in this order. In this occasion, suitable dry-etching method is used for each etching In FIG. 2(e), at first, masking oxide film 11 is generated by heat oxidation. After this, N-type impurity is implanted into the source and drain regions by photo-lithographic implantation technique known in public. And, an N+ impurity diffusing region 12 is formed by annealing. Thus, the source and drain regions of memory element are formed.

However, the conventional art mentioned above has some problems as follows.

In FIG. 2(b), as a result of patterning the first poly-silicon 4, there is a region where the first poly-silicon 4 is already removed from the silicon substrate. This is a region of boundary portion between the patterned poly-silicon 4.

In FIG. 2(d), an over-etching occurs at the region of this boundary portion, when the first poly-silicon 4 is etched. As a result, a region 10 where the portion of silicon substrate 1 is gouged away, is generated.

Therefore, in FIG. 2(e), at the step portions of both sides of the region 10, the density of impurity (N+) about horizontal direction in the drawings, locally decrease, causing high resistant region 13.

By such a high resistant region 13, source line resistance increases. As a result, caused is an inconvenience of deteriorating writing characteristic of memory cell.

To relieve this inconvenience, what is easily conceived is to adopt a simple method of increasing the density of N+ impurity which is implanted into source and drain regions, not to cause regions where N+ impurity density becomes thin. Moreover, other methods can be conceived. Those are a method of increasing annealing temperature or a method of extending annealing time, so as to form N+ impurity diffusing region deeply. But, these methods have a side effect. That is, by these methods caused is another inconvenience of increasing effect of shortening channel between source and drain. So, these methods are not practical.

Therefore, there had been a subject of relieving these inconveniences adequately.

Meanwhile, there is a conventional method of diffusing impurity selectively into the step portions of region 10 (c.f. JP 03-211774).

However, this method needs an etching technique of RIE method, to form impurity portions at the side wall of the step portions. So, this method comprises rather complicated process.

SUMMARY OF THE INVENTION

The present invention adopts the following configuration to solve the problems mentioned above.

As a first configuration, provided is a method for manufacturing nonvolatile semiconductor memory including the following processes.

As a first process, a first poly-silicon is patterned to divide the first poly-silicon into each memory element and expose silicon substrate portions which comprise boundary of the memory element.

As a second process, a second poly-silicon is formed on silicon substrate which boundary portions are exposed by patterning the first poly-silicon.

As a third process, a first impurity diffusing region is formed by diffusing impurity, which is included in the second poly-silicon, into the silicon substrate portion at the first poly-silicon boundary, with heat-treatment.

As a fourth process, a control gate and a floating gate is formed by using the first poly-silicon and the second poly-silicon as a material of a floating gate, forming a material of an intermediate insulating film on this material, forming a material of a control gate on this material, and etching these materials.

As a fifth process, a second impurity diffusing region, which includes source and drain regions of a memory element, is formed in the silicon substrate, and this second impurity diffusing region is connected with said first impurity diffusing region.

Moreover, forming a first impurity diffusing region is performed by the heat-treatment of forming a material of an intermediate insulating film.

As a second configuration, provided is a method for manufacturing nonvolatile semiconductor memory including the following processes.

As a first process, a first poly-silicon is patterned to divide the first poly-silicon into each memory element by local oxidation of silicon and form a first oxide film at the boundary portions between the memory element.

As a second process, a control gate and a floating gate is formed by using the first poly-silicon as a material of a floating gate, forming a material of an intermediate insulating film on this material, forming a material of a control gate on this material, and etching these materials.

As a third process, an impurity diffusing region, which includes source and drain regions of a memory element, is formed in the silicon substrate.

DETAILED DESCRIPTION OF THE PREFERRED EMBODIMENTS

Figure 1A:
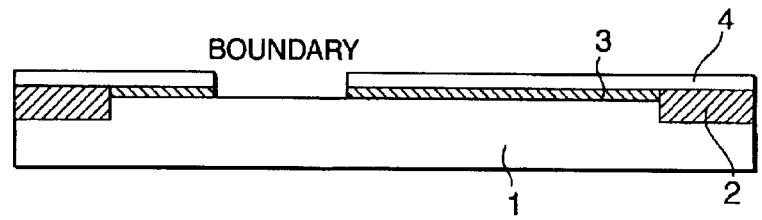
FIG. 1 shows each process of a method for manufacturing nonvolatile semiconductor memory device of Embodiment 1 according to present invention.
Figure 1B:
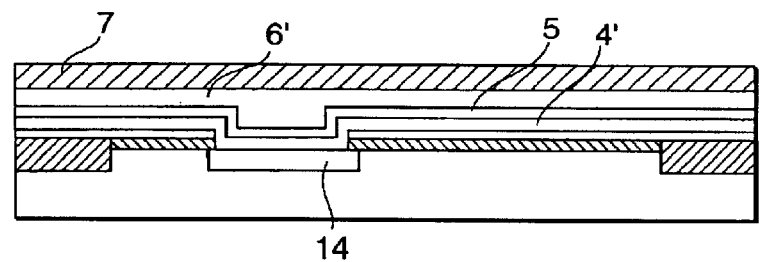
Figure 1C:
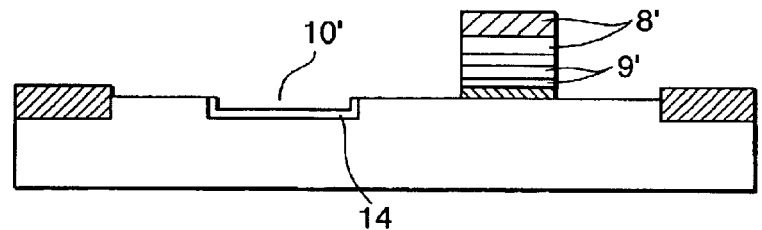
Figure 1D:
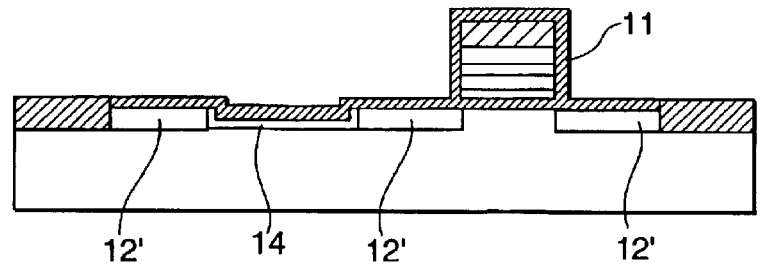

Hereafter, the preferred embodiments according to present invention is described referring to the appended drawings.

Embodiment 1

The present invention will be more clearly understood by Embodiment 1 of the present invention shown in FIG. 1.

Each process which comprises the method of Embodiment 1 is shown in FIG. 1(*a*) to FIG. 1(*d*).

As shown in FIG. 1(*a*), in an initial process of manufacturing memory device, at first, on a silicon substrate 1, a field oxide film 2 is formed by LOCOS method which is known in public. This field oxide film 2 is formed like latticework. In FIG. 1(*a*) to FIG. 1(*d*), shown is a section of a portion of silicon substrate 1 located between neighboring lattices. Thus, the surface of silicon substrate 1 is divided into blocks, so as to form regions for memory elements. These are same as the conventional art.

Next, in FIG. 1(*a*), a gate oxide film 3 is generated by oxidation with heat-treatment. This comprises an insulating film for insulating a floating gate from the silicon substrate 1.

And, on this gate oxide film 3, generated is a first poly-silicon 4, which includes N-type impurity, by LPCVD method known in public. This comprises a portion of a floating gate in the later process.

Here, for the purpose of finishing a floating gate adequately, when it is formed in the later process, the first poly-silicon 4 is treated as follows.

That is, a lattice patterning is performed by photo-lithographic etching technique known in public. Thus, region of the boundary portion shown in the drawings is formed. And, formed is each first poly-silicon 4 divided into each element.

In Embodiment 1 of present invention, the portion of the gate oxide film 3 located at this boundary portion is also etched, in this occasion.

Next, in FIG. 1(*b*), at first, a second poly-silicon 4', which includes N-type impurity, is generated by LPCVD method known in public. This comprises a portion of a floating gate. And, it is also generated at the region of boundary portion.

Then, an IPO film 5, which comprises ONO film etc. is generated by a certain method known in public. This is an intermediate insulating film between the floating gate and a control gate. As an example of this, a three-storied structure of oxide film, nitride film and oxide film, is used. A heat-treatment is performed in this occasion. By this heat-treatment, an N-type impurity in the second poly-silicon 4' is diffused into the region located at the boundary portion of silicon substrate 1. Thus, a first N-type impurity diffusing region 14 is formed. Meanwhile, gouging away of silicon occurs at the region of boundary portion of silicon substrate 1, generating a region 10' (c.f. FIG. 1(*c*)) with etching treatment performed to the oxide film in the later process.

This first N+ impurity diffusing region 14 is formed to overlap this region 10'.

After this, a third poly-silicon 6' which includes N-type impurity, is generated by LPCVD method known in public. This is going to comprise a portion of control gate in the later process.

Next, a high melting point metallic silicide 7 such as WSix etc. is formed by spattering method or LPCVD method known in public. This is going to comprise a portion of control gate in the later process.

In FIG. 1(*c*), patterning is performed by photo-lithographic etching technique known in public. By this patterning, formed is a control gate 8' which comprises high melting point metallic suicide 7 and third poly-silicon 6'. In addition, formed is a floating gate 9' which comprises first poly-silicon 4 and second poly-silicon 4'. These are performed by etching suicide 7, third poly-silicon 6', IPO film 5, second poly-silicon 4', first poly-silicon 4 and gate oxide film 3 respectively in this order. In this occasion, suitable dry-etching method is used for each etching.

In this process, the region of the boundary portion in silicon substrate 1 is gouged away, causing a region 10' which is similar to the conventional art. However, this region 10' is formed in the first N+ impurity diffusing region 14 which has been formed before. Therefore, the first N+ impurity diffusing region 14 is remained around this region 10'.

In FIG. 1(*d*), at first, masking oxide film 11 is generated by heat oxidation. After this, N-type impurity is implanted into the source and drain regions by photo-lithographic implantation technique. And, a second N+ impurity diffusing region 12' is formed by annealing. Thus, the source and drain regions of memory element are formed.

Effect of Embodiment 1

As described above, according to Embodiment 1, local decreasing of N+ density at the step portion of region 10' which has been generated by gouging away the region of boundary portion in silicon substrate 1, is prevented when a memory element is formed. Therefore, increasing of source line resistance is restrained. And, writing characteristic etc. of memory cell can be increased. Moreover, the existence of the first N+ impurity diffusing region 14 does not cause shortening of the channel between source and drain. Therefore, free arrangement of processes can be realized.

Embodiment 2

FIG. 3 shows another embodiment of the method for manufacturing nonvolatile semiconductor memory according to present invention.

Each process which comprises the method of Embodiment 2 is shown in FIG. 3(a) to FIG. 3(e).

Figure 3A:
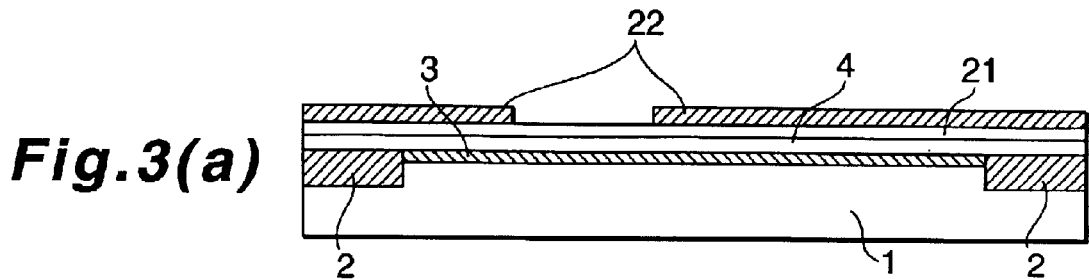
FIG. 3 shows each process of a method for manufacturing nonvolatile semiconductor memory device of Embodiment 2 according to present invention.

As shown in FIG. 3(a), in an initial process of manufacturing memory device, at first, as same as Embodiment 1, on a silicon substrate 1, a field oxide film 2 is formed by LOCOS method known in public. Thus, the surface of silicon substrate 1 is divided into blocks, so as to form regions for memory elements.

Next, in FIG. 3(a), a gate oxide film 3 is generated by oxidation with heat-treatment. This comprises an insulating film for insulating a floating gate from the silicon substrate 1.

And, on this gate oxide film 3, generated is a first poly-silicon 4, which includes N-type impurity, by LPCVD method known in public. This comprises a portion of a floating gate in the later process.

After this, a first oxide film 21 is formed by heat oxidation. This film is what prevents the first poly-silicon 4 from being over-etched when a nitride film 22 on it is removed in later process.

A nitride film 22 is formed on the first poly-silicon 4 by LPCVD method known in public. This nitride film 22 is given patterning by photo-lithographic etching technique known in public.

Here, in Embodiment 2, for the purpose of finishing a floating gate adequately, when it is formed in the later process, the first poly-silicon 4 is treated as follows.

Figure 3B:
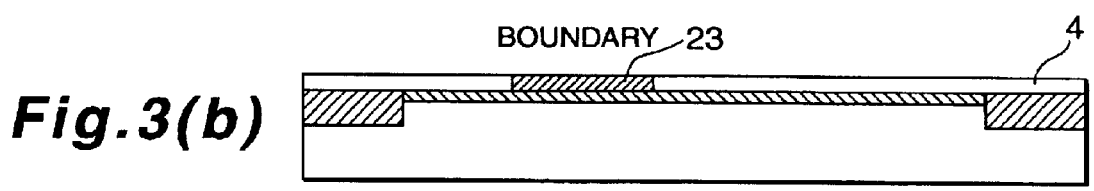

That is, in FIG. 3(b), the first poly-silicon 4 is selectively oxidized with masking material of nitride film 22. Thus, in the region of the boundary portion shown in the drawings, a second oxide film 23 is formed. And, these nitride film 22 and first oxide film 21 are removed by a certain etching technique known in public. Thus, formed is each first poly-silicon 4 divided by the second oxide film 23 into each element.

Figure 3C:
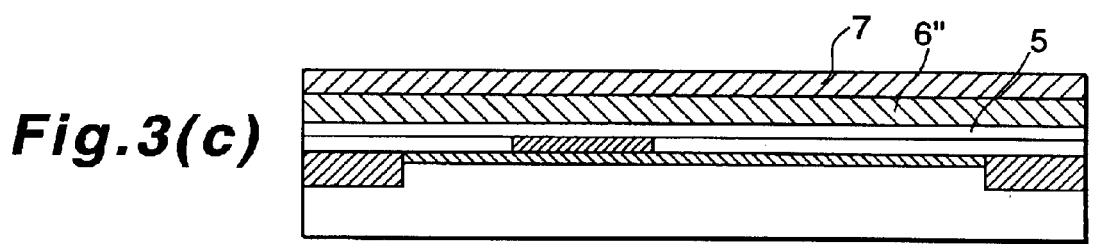

In FIG. 3(c), an IPO film 5, which comprises ONO film etc. is generated by a certain method known in public. This is an intermediate insulating film between the floating gate and a control gate. As an example of this, a three-storied structure of oxide film, nitride film and oxide film, is used.

After this, a second poly-silicon 6" which includes N-type impurity, is generated by LPCVD method known in public. This is going to comprise a portion of control gate in the later process. Next, a high melting point metallic silicide 7 such as WSix etc. is formed by spattering method or LPCVD method known in public. This is going to comprise a portion of control gate in the later process.

Figure 3D:
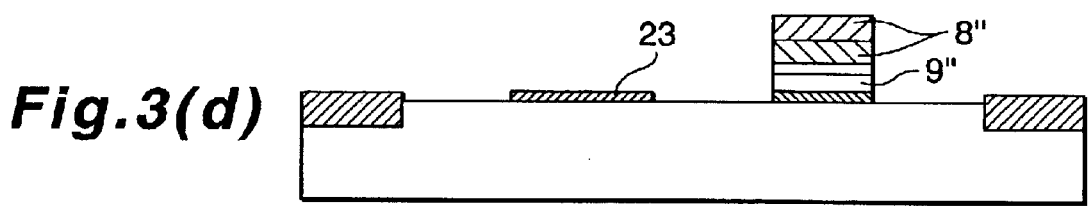

In FIG. 3(d), patterning is performed by photo-lithographic etching technique known in public. By this patterning, formed is a control gate 8" which comprises high melting point metallic silicide 7 and second poly-silicon 6". In addition, formed is a floating gate 9" which comprises first poly-silicon 4. These are performed by etching silicide 7, second poly-silicon 6", IPO film 5, first poly-silicon 4 and gate oxide film 3 respectively in this order with suitable dry-etching method is used for each etching.

Figure 2A:
FIG. 2 shows each process of a method for manufacturing nonvolatile semiconductor memory device of conventional art.
Figure 2B:
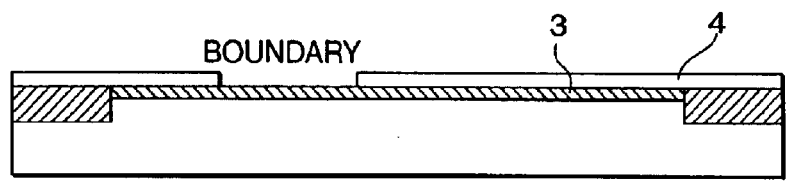
Figure 2C:
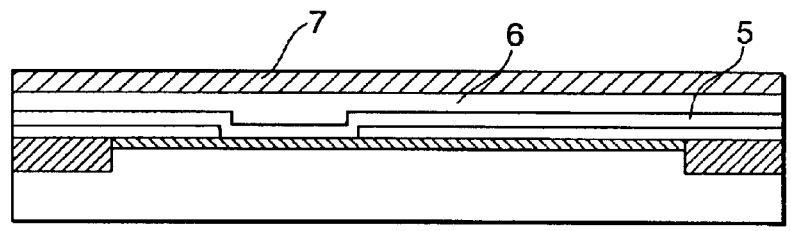
Figure 2D:
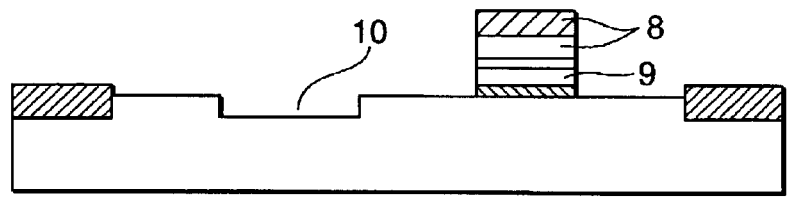

In this process, as shown in FIG. 3(b), the second oxide film 23 is formed in the region of the boundary portion between the first poly-silicon 4. So, silicon substrate 1 is not gouged away. That is, a region 10, which occurred in the conventional art (c.f. FIG. 2(d), does not occur, though the second oxide film 23 is etched when the first poly-silicon 4 is etched. This is why the second oxide film 23 is sufficiently thick.

Figure 2E:
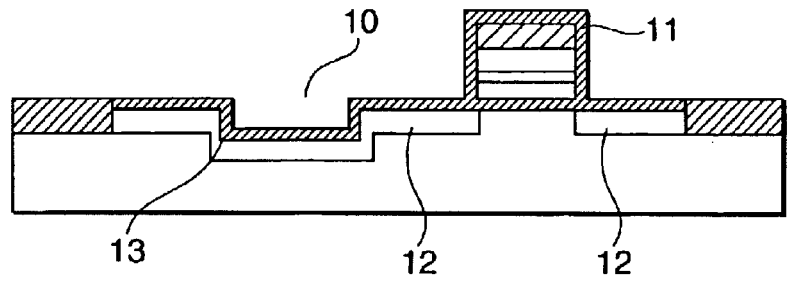
Figure 3E:
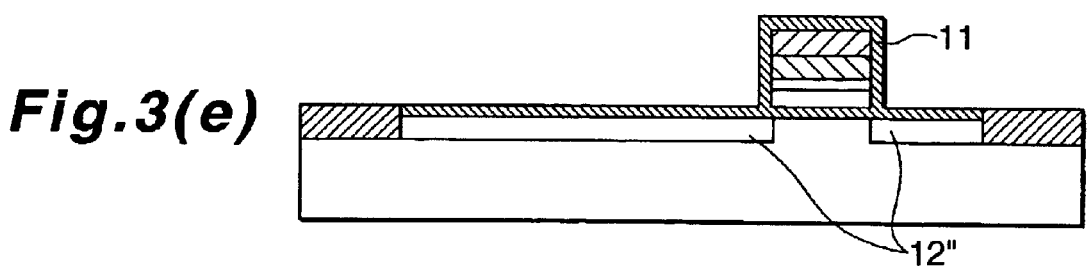

In FIG. 3(e), masking oxide film 11 is generated by heat oxidation. After this, N-type impurity is implanted into the source and drain regions by photo-lithographic implantation technique. And, an N+ impurity diffusing region 12" is formed by annealing. In this occasion in the source and drain regions of memory element, what is a high resistant region 13 shown in FIG. 2(e), is never formed.

Effect of Embodiment 2

As described above, according to Embodiment 2, generation of regions where local N+ density decreases is prevented, because gouging away of the region of a boundary portion in silicon substrate 1 does not occur when a memory element is formed. Therefore, increasing of source line resistance is restrained. And, writing characteristic etc. of a memory cell can be made better. Moreover, as compared with Embodiment 1, N+ impurity density in source line region can be kept almost equivalent to the N+ impurity density of source and drain regions. So, the source line resistance considerably decreases.

Incidentally, the present invention is not limited to each embodiment mentioned above. It goes without saying that it can be varied to other styles. For example, it is apparent that the impurity added to semiconductor can be P-type.

What is claimed is:

1. A method of manufacturing a nonvolatile semiconductor memory comprising:

providing a silicon substrate;

depositing a gate oxide film on the silicon substrate;

depositing a first poly-silicon layer on the gate oxide film;

patterning the first poly-silicon layer and the gate oxide film to divide the first poly-silicon layer and the gate oxide film into memory elements and to expose silicon substrate portions which are boundaries of the memory elements;

forming a second poly-silicon layer on the silicon substrate portions and on the first poly-silicon layer, the second poly-silicon layer having an impurity therein;

forming a first impurity diffusing region by diffusing the impurity from the second poly-silicon layer into the silicon substrate portions, by a heat-treatment;

depositing an intermediate insulating film on the second poly-silicon layer;

depositing a silicide layer over the intermediate insulating film;

etching the first and second poly-silicon layers, the intermediate insulating film and the silicide layer to form a control gate and a floating gate;

forming a second impurity diffusing region, which includes source and drain regions of a memory element, in the silicon substrate; and connecting the second impurity diffusing region with the first impurity diffusing region.

2. The method of manufacturing a nonvolatile semiconductor memory according to claim 1, wherein the heat treatment used to form the first impurity diffusing region is performed as part of said depositing an intermediate insulating film.

3. The method of manufacturing a nonvolatile semiconductor memory according to claim 1, wherein said forming a second impurity diffusing region is performed by a heat-treatment.

4. A method of manufacturing a nonvolatile semiconductor memory comprising:

providing a silicon substrate;

depositing a gate oxide film on the silicon substrate;

depositing a poly-silicon layer on the gate oxide film;

forming a first oxide film in the poly-silicon layer to form boundary portions that divide the poly-silicon layer into memory elements;

depositing an intermediate insulating film on the first oxide film and the poly-silicon layer;

depositing a silicide layer over the intermediate insulating film etching the poly-silicon layer, the intermediate insulating film and the silicide layer to form a control gate and a floating gate; and forming an impurity diffusing region, which includes source and drain regions of a memory element, in the silicon substrate.

5. The method of manufacturing a nonvolatile semiconductor memory of claim 1, wherein the intermediate insulating film is a multilayered structure including a first oxide film, a nitride film and a second oxide film.

6. The method of manufacturing a nonvolatile semiconductor memory of claim 1, wherein the silicide layer comprises tungsten suicide.

7. The method of manufacturing a nonvolatile semiconductor memory of claim 4, wherein said forming a first oxide film comprises:

depositing an oxide layer on the poly-silicon layer;

forming a mask layer on the oxide layer; and selectively oxidizing the poly-silicon layer through the mask layer to form the first oxide film.

8. The method of manufacturing a nonvolatile semiconductor memory of claim 4, wherein the intermediate insulating film is a multilayered structure including a first oxide film, a nitride film and a second oxide film.

9. The method of manufacturing a nonvolatile semiconductor memory of claim 4, wherein the silicide layer comprises tungsten suicide.

* * * * *